(12) United States Patent
Fulcher

(10) Patent No.: US 6,828,643 B2
(45) Date of Patent: Dec. 7, 2004

(54) BONDING PADS OVER INPUT CIRCUITS

(75) Inventor: Edwin M. Fulcher, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/287,668

(22) Filed: Nov. 4, 2002

(65) Prior Publication Data
US 2004/0084742 A1 May 6, 2004

(51) Int. Cl.$^7$ .............................. H01L 31/00
(52) U.S. Cl. ................ 257/459; 257/678; 257/691; 257/692
(58) Field of Search ............... 257/734, 459, 257/678, 691, 692, 694

(56) References Cited

U.S. PATENT DOCUMENTS

| 5,340,771 A | | 8/1994 | Rostoker ............... 437/209 |
| 5,672,911 A | * | 9/1997 | Patil et al. ............ 257/691 |
| 6,008,534 A | * | 12/1999 | Fulcher ................. 257/691 |
| 6,057,169 A | | 5/2000 | Singh et al. ............ 438/14 |
| 6,064,113 A | * | 5/2000 | Kirkman ............... 257/691 |

* cited by examiner

Primary Examiner—Long Pham
Assistant Examiner—Nathan W. Ha
(74) Attorney, Agent, or Firm—Luedeka, Neely & Graham, P.C.

(57) ABSTRACT

An integrated circuit having functional circuitry within a core portion of the integrated circuit. Input circuits are disposed on a first layer within a peripheral portion of the integrated circuit, where the input circuits are electrically connected to the functional circuitry. Power and ground buss lines are disposed on a second layer within the peripheral portion of the integrated circuit, where the second layer overlies the first layer. The power and ground buss lines overlie the input circuits, and are electrically connected to the input circuits. Bonding pads are disposed on a third layer within the peripheral portion of the integrated circuit, where the third layer overlies the second layer. The bonding pads overlie the power and ground buss lines and the input circuits, and are electrically connected to the input circuits.

6 Claims, 1 Drawing Sheet

BONDING PADS OVER INPUT CIRCUITS

FIELD

This invention relates to the field of integrated circuits. More particularly, this invention relates to integrated circuit design.

BACKGROUND

Input output cells, referred to herein as input circuits, deliver input signals to and carry output signals from monolithic integrated circuits. The input circuits are typically disposed near a peripheral edge of the integrated circuit, and are connected to bonding pads through which electrical connections are made to other elements of a larger circuit, such as a package for the integrated circuit.

Input circuits are typically electrically connected to two electrical buses, being VDDio and VSSio. In general terms, these two buses comprise the power and ground signals used to power the input circuits. The power and ground buses are typically disposed in two concentric rings around the peripheral edge of the integrated circuit.

Integrated circuits are typically laid out with the bonding pads closest to the peripheral edge of the integrated circuit. The bonding pads are then electrically connected via electrically conductive traces to the input circuits, which are disposed concentrically within the ring or rings of bonding pads, closer in towards the center of the integrated circuit. The two buss lines may then be disposed in concentric loops within the ring of input circuits. With the bonding pads, input circuits, and two buss lines all disposed in such separate concentric rings around the periphery of the integrated circuit, a tremendous amount of surface area is consumed.

As the number of devices on the integrated circuit has generally increased, and the overall size of the integrated circuit has generally decreased, the space required for the buss lines, bonding pads, and input circuits has become more of a problem when integrated circuits are laid out, in that they tend to increase the size of the integrated circuit beyond what is required for the functional circuitry.

There is a need, therefore, is an integrated circuit design in which less space is required for the input circuits, bonding pads, and buss lines.

SUMMARY

The above and other needs are met by an integrated circuit having functional circuitry within a core portion of the integrated circuit. Input circuits are disposed on a first layer within a peripheral portion of the integrated circuit, where the input circuits are electrically connected to the functional circuitry. Power and ground buss lines are disposed on a second layer within the peripheral portion of the integrated circuit, where the second layer overlies the first layer. The power and ground buss lines overlie the input circuits, and are electrically connected to the input circuits. Bonding pads are disposed on a third layer within the peripheral portion of the integrated circuit, where the third layer overlies the second layer. The bonding pads overlie the power and ground buss lines and the input circuits, and are electrically connected to the input circuits.

In this manner, less space is required for the input functions of the integrated circuit, because the input circuits, buss lines, and bonding pads are disposed on overlying layers. By making better use of vertical space in this manner, less horizontal space is required for the input functions, and the integrated circuit die dimensions can be made commensurately smaller.

In various preferred embodiments, the bonding pads are disposed in concentric rows, where the bonding pads may alternately be aligned between adjacent concentric rows or offset one to another between adjacent concentric rows. The bonding pads may alternately be configured for either wire bonding or stud bonding.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
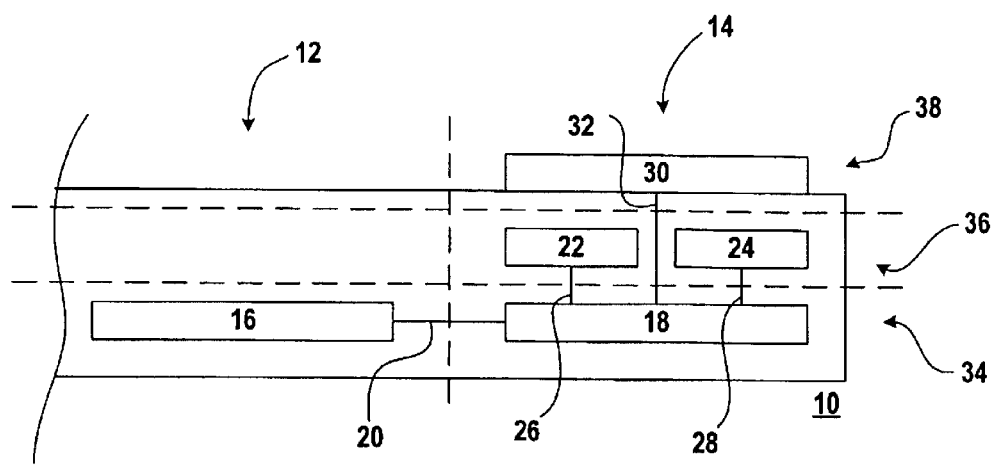
FIG. 1 is a cross sectional view of an integrated circuit, depicting the overlying layers of the input circuits, buss lines, and bonding pads.

With reference now to FIG. 1, there is depicted a cross sectional view of a portion of an integrated circuit 10, depicting the overlying layers 34, 36, and 38, wherein reside the input circuits 18, buss lines 22 and 24, and bonding pads 30, respectively. It is appreciated that the layers 34, 36, and 38 are logical separations, and preferably represent several layers each. The concept provided by the layers 34, 36, and 38 is that the input circuits 18, buss lines 22 and 24, and bonding pads 30 do not reside on layers that overlap one another in a vertical direction. However, the input circuits 18, buss lines 22 and 24, and bonding pads 30 do overlap one another in a horizontal direction, which is how surface area on the integrated circuit 10 is reduced in the present invention. Thus, FIG. 1 is in some respects a functional representation of an integrated circuit 10.

As depicted in FIG. 1, functional circuitry 16 resides within a core portion 12 of the integrated circuit 10. Although it is appreciated that all circuitry is functional to the extent that it operates as designed and performs a valuable function, the designation of functional circuitry as used herein is meant to imply that circuitry for which the integrated circuit 10 is being fabricated, rather than the input circuits which provide access to the functional circuitry.

The functional circuitry 16 is electrically connected to the input circuit 18, which resides in the peripheral portion 14 of the integrated circuit 10, such as by electrical connection 20. It is appreciated that the electrical connection 20 is representational only, and that such electrical connection may actually be made via conductive structures that reside on several layers within the integrated circuit 10. The input circuit 18 is then electrically connected to the buss lines 22 and 24, such as by electrical connections 26 and 28. The buss lines 22 and 24 also preferably reside in the peripheral portion of the integrated circuit 10. The input circuit 18 is also electrically connected to a bonding pad 30, such as by electrical connection 32. As depicted in FIG. 1, all of the input circuits 18, buss lines 22 and 24, and bonding pads 30 preferably reside in the peripheral portion 14 of the integrated circuit 10, but reside within different layers 34, 36, and 38, which overlie one another.

Figure 2:
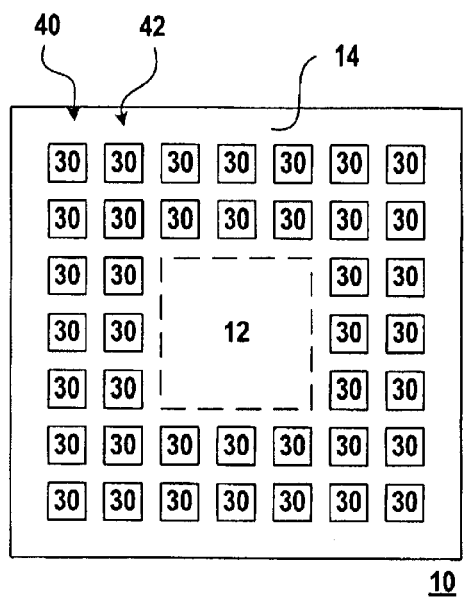
FIG. 2 is top plan view of an integrated circuit, depicting concentric aligned rings of bonding pads.

FIG. 2 is a top plan view of one embodiment of the integrated circuit 10, in which the bonding pads 30 in the peripheral portion 14 of the integrated circuit 10 are disposed in concentric rows 40 and 42, where the bonding pads 30 are aligned in adjacent rows. Such an aligned arrangement may be beneficial when the integrated circuit 10 is electrically connected to other circuits via stud bumps.

It is appreciated that in actual embodiment, the bonding pads 30 would be much smaller in relation to the overall size of the integrated circuit 10, and the peripheral portion 14 of the integrated circuit 10 would be much smaller in relation to the size of the core portion 12 of the integrated circuit 10. However, FIG. 2 has been so drawn so as to provide clear detail as to the aligned nature of the bonding pads 30. It is also appreciated that in actual implementation, there may be many more bonding pads 30 than depicted in FIG. 2, and there may also be many more concentric rows than just the two rows depicted.

Figure 3:
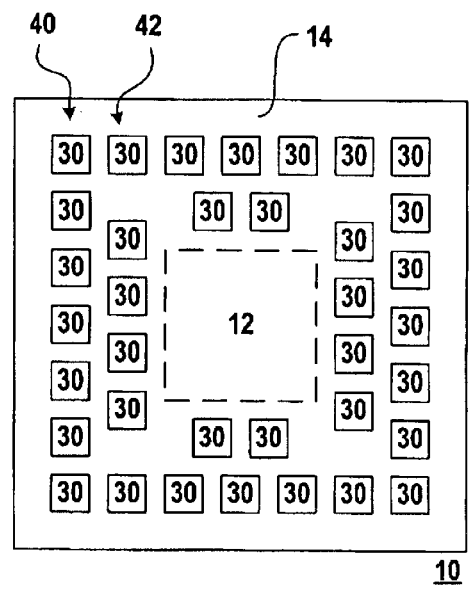
FIG. 3 is a top plan view of an integrated circuit, depicting concentric off set rings of bonding pads.

FIG. 3 depicts an alternate embodiment where the bonding pads 30 are disposed in an off set manner between the concentric rows 40 and 42. Such an offset arrangement may be beneficial when the integrated circuit 10 is electrically connected to other circuits via wire bonding.

Thus, with the input circuit 18, buss lines 22 and 24, and bonding pads 30 vertically aligned, one above the other, a relatively small amount of surface area is required in the peripheral portion 14 of the integrated circuit 10, and the integrated circuit 10 may be formed on a smaller die than would otherwise be required. Further, by having the buss lines 22 and 24 disposed between the bonding pad 30 and the input circuit 18, which resides on the same level as the functional circuitry 16, the integrated circuit 10 is easier to fabricate, and the layers between the input circuit 18 and the bonding pad 30 help provide structural support which reduce damage to the input circuit 18 when bonding operations are performed on the bonding pad 30.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An integrated circuit, comprising:

functional circuitry within a core portion of the integrated circuit, input circuits disposed on a first layer within a peripheral portion of the integrated circuit, the input circuits electrically connected to the functional circuitry, power and ground buss lines disposed on a second layer within the peripheral portion of the integrated circuit, where the second layer overlies the first layer, and the power and ground buss lines overlie the input circuits, the power and ground buss lines electrically connected to the input circuits, and bonding pads disposed on a third layer within the peripheral portion of the integrated circuit, where the third layer overlies the second layer, and the bonding pads overlie the power and ground buss lines and the input circuits, the bonding pads electrically connected to the input circuits.

2. The integrated circuit of claim 1 wherein the bonding pads are disposed in concentric rows.

3. The integrated circuit of claim 1 wherein the bonding pads are disposed in concentric rows and the bonding pads are aligned between adjacent concentric rows.

4. The integrated circuit of claim 1 wherein the bonding pads are disposed in concentric rows and the bonding pads are offset one to another between adjacent concentric rows.

5. The integrated circuit of claim 1 wherein the bonding pads are configured for wire bonding.

6. The integrated circuit of claim 1 wherein the bonding pads are configured for stud bonding.

* * * * *